United States Patent
Wang et al.

(10) Patent No.: US 10,147,561 B2
(45) Date of Patent: Dec. 4, 2018

(54) UNIVERSAL CIRCUIT BOARD FOR MECHANICAL KEYSWITCH AND OPTICAL KEYSWITCH

(71) Applicant: PixArt Imaging Inc., Hsin-Chu (TW)

(72) Inventors: Tsung-Fa Wang, Hsin-Chu (TW); Shih-Wei Kuo, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

(21) Appl. No.: 15/490,903

(22) Filed: Apr. 19, 2017

(65) Prior Publication Data

US 2018/0151308 A1    May 31, 2018

(30) Foreign Application Priority Data

Nov. 29, 2016    (TW) .............................. 105139326 A

(51) Int. Cl.
   *H01H 13/70*    (2006.01)
   *H01H 3/12*    (2006.01)
   *H03K 17/94*    (2006.01)

(52) U.S. Cl.
   CPC ........... *H01H 3/125* (2013.01); *H03K 17/941* (2013.01); *H01H 2221/008* (2013.01)

(58) Field of Classification Search
   CPC .......... H05K 7/00; H01H 13/02; H01H 13/23; H01H 13/70; H01H 13/785; H03K 17/941; H03K 17/964
   USPC ........ 361/781; 310/311, 339; 200/5 A, 16 A, 200/18, 181, 265; 385/19
   See application file for complete search history.

(56) References Cited

U.S. PATENT DOCUMENTS

| | | | | |
|---|---|---|---|---|
| 3,705,276 A | * | 12/1972 | Seeger, Jr. ............. | H01H 1/029 200/16 A |
| 3,916,360 A | * | 10/1975 | Pedersen ................. | H01H 1/403 200/243 |
| 3,928,741 A | * | 12/1975 | Comer .................... | H01H 13/48 200/345 |
| 4,439,649 A | * | 3/1984 | Cecchi .................... | G05G 9/047 200/5 R |
| 4,696,096 A | * | 9/1987 | Green ..................... | B23K 1/012 228/180.21 |
| 5,201,016 A | * | 4/1993 | Jinbo ..................... | G02B 6/3508 385/19 |
| 5,283,606 A | * | 2/1994 | Konno .................... | G03B 7/091 396/299 |
| 5,413,083 A | * | 5/1995 | Jones ...................... | F41B 11/52 124/32 |
| 9,142,374 B1 | * | 9/2015 | Shen ....................... | H01P 1/125 |
| 2003/0094354 A1 | * | 5/2003 | Badarneh .............. | G06F 3/0338 200/18 |
| 2004/0075360 A1 | * | 4/2004 | Stadelmann ............ | H01H 9/16 310/311 |

(Continued)

*Primary Examiner* — Xiaoliang Chen
(74) *Attorney, Agent, or Firm* — Winston Hsu

(57) ABSTRACT

A universal circuit board compatible for a mechanical keyswitch and an optical keyswitch includes a main body, a plurality of conductive terminals and an opening structure. The main body has a first surface and a second surface opposite to each other. The plurality of conductive terminals is disposed on the first surface of the main body. The opening structure is formed on the main body and pierces through the first surface and the second surface. The opening structure can be inserted by an axle body of the mechanical keyswitch or be an optical transmission channel of the optical keyswitch.

6 Claims, 7 Drawing Sheets

(56) References Cited

U.S. PATENT DOCUMENTS

2010/0234768 A1\* 9/2010 Uchiyama .......... A61B 5/15134
                                                                          600/583

\* cited by examiner

UNIVERSAL CIRCUIT BOARD FOR MECHANICAL KEYSWITCH AND OPTICAL KEYSWITCH

BACKGROUND OF THE INVENTION

1. Field of the Invention

The present invention relates to a circuit board utilized to install a keyswitch, and more particularly, to a universal circuit board compatible for a mechanical keyswitch and an optical keyswitch.

2. Description of the Prior Art

Please refer to FIG. 7. FIG. 7 is an assembly diagram of a keyswitch 70 and a circuit board 72 in prior art. The conventional circuit board 72 is a solid board whereon a plurality of transmission terminals 74 is disposed. The keyswitch 70 is disposed on the circuit board 72, and a resilient actuating component 76 of the keyswitch 70 contacts against the transmission terminals 74. While the keycap 78 is pressed downwardly, the resilient actuating component 76 is resiliently deformed by pressure of the keycap 78 to forma conduction channel and to generate an actuating signal, and the actuating signal is transmitted to the signal processor by the transmission terminals 74 for analysis; the foresaid keyswitch 70 is represented as a mechanical keyswitch. While an optical keyswitch is assembled with the conventional circuit board 72, inner structural arrangement of the keyswitch 70 has to be redesigned, for example, the keycap and the below resilient supporting component are upwardly shifted to vacate space inside the main body of the keyswitch for installing an optical detector. Therefore, the conventional circuit board cannot be conveniently assembled with and disassembled from the keyswitch having different standards.

SUMMARY OF THE INVENTION

The present invention provides a universal circuit board compatible for a mechanical keyswitch and an optical keyswitch for solving above drawbacks.

According to the claimed invention, a universal circuit board compatible for a mechanical keyswitch and an optical keyswitch is disclosed. The universal circuit board includes a main body, a plurality of conductive terminals and an opening structure. The main body has a first surface and a second surface opposite to each other. The plurality of conductive terminals is disposed on the first surface of the main body. The opening structure is formed on the main body and pierces through the first surface and the second surface. The opening structure is inserted by an axle body of the mechanical keyswitch or is an optical transmission channel of the optical keyswitch.

According to the claimed invention, the plurality of conductive terminals are respectively connected to a plurality of resilient components of the mechanical keyswitch, the plurality of conductive terminals are utilized to transmit a conduction signal generated by deformation of the plurality of resilient components while a keycap of the mechanical keyswitch is moved related to the axle body and the plurality of resilient components are pressed and deformed.

According to the claimed invention, the universal circuit board further includes a circuit substrate and an optical detecting unit. The circuit substrate is disposed on the second surface of the main body. The optical detecting unit is disposed on a side of the circuit substrate facing the second surface and aligning with the opening structure. An optical detecting signal output by the optical detecting unit passes through the opening structure and is exited from the first surface to detect a movement of a keycap of the optical keyswitch.

According to the claimed invention, the optical detecting unit is disposed inside a positioning hole structure of the optical keyswitch. Or, the universal circuit board further includes a constraining component disposed on the side of the circuit substrate facing the second surface and adapted to insert into a positioning hole structure of the optical keyswitch.

According to the claimed invention, the universal circuit board further includes an operational processing unit disposed on the main body. The operational processing unit determines that the opening structure is assembled with the mechanical keyswitch while the plurality of conductive terminals are detected to transmit a conductive signal, and further determines that the opening structure is assembled with the optical keyswitch while the plurality of conductive terminals make no contact. The mechanical keyswitch and the optical keyswitch are disposed on the first surface of the main body in a detachable manner.

The universal circuit board of the present invention can be compatible for the mechanical keyswitch and the optical keyswitch. The mechanical keyswitch and the optical keyswitch are installed on the first surface of the main body of the universal circuit board in a detachable manner, and the keyswitch with any standards can be arbitrarily assembled with and disassembled from the universal circuit board according to the user's actual demand. The universal circuit board has the conductive terminals and the opening structure formed on the main body, the opening structure not only can be inserted by the mechanical keyswitch for constraint, but also can utilize the open-typed hole to establish the optical transmission channel for the optical detecting unit of the optical keyswitch. The operational processing unit of the universal circuit board can determine the universal circuit board is assembled with the mechanical keyswitch or the optical keyswitch according to the conduction signal about the conductive terminal and/or generation of the optical detecting signal, so as to activate related calculation for executing the actuating command of the keyswitch. Comparing to the prior art, the universal circuit board of the present invention can be compatible for the mechanical keyswitch and the optical keyswitch, the user can conveniently assemble and disassemble the keyswitch with any structural standards and the universal circuit board is applied to automatically acquire characteristics of the keyswitch for achieving the plug and play function.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
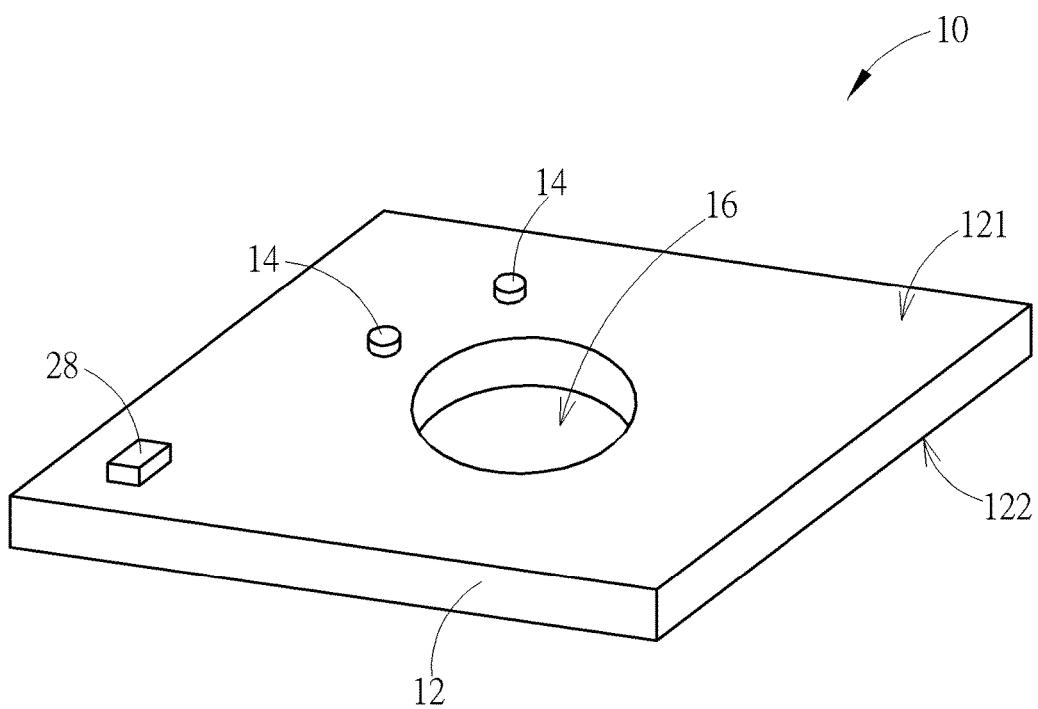
FIG. 1 is a diagram of a universal circuit board according to an embodiment of the present invention.

Please refer to FIG. 1. FIG. 1 is a diagram of a universal circuit board 10 according to an embodiment of the present invention. The universal circuit board 10 includes a main body 12, conductive terminals 14 and an opening structure 16. The main body 12 has a first surface 121 and a second surface 122 opposite to each other. The conductive terminals 14 are disposed on the first surface 121. The opening structure 16 is formed on the main body 12 and preferably disposed adjacent by the conductive terminals 14. The opening structure 16 is formed through the first surface 121 and the second surface 122 of the main body 12 to become an open-typed hole. The universal circuit board 10 of the present invention can be compatible for assembly standards of a mechanical keyswitch and an optical keyswitch, and the keyswitch with any shapes can be conveniently assembled with and disassembled from the universal circuit board 10 according to user's actual demand.

Figure 2:
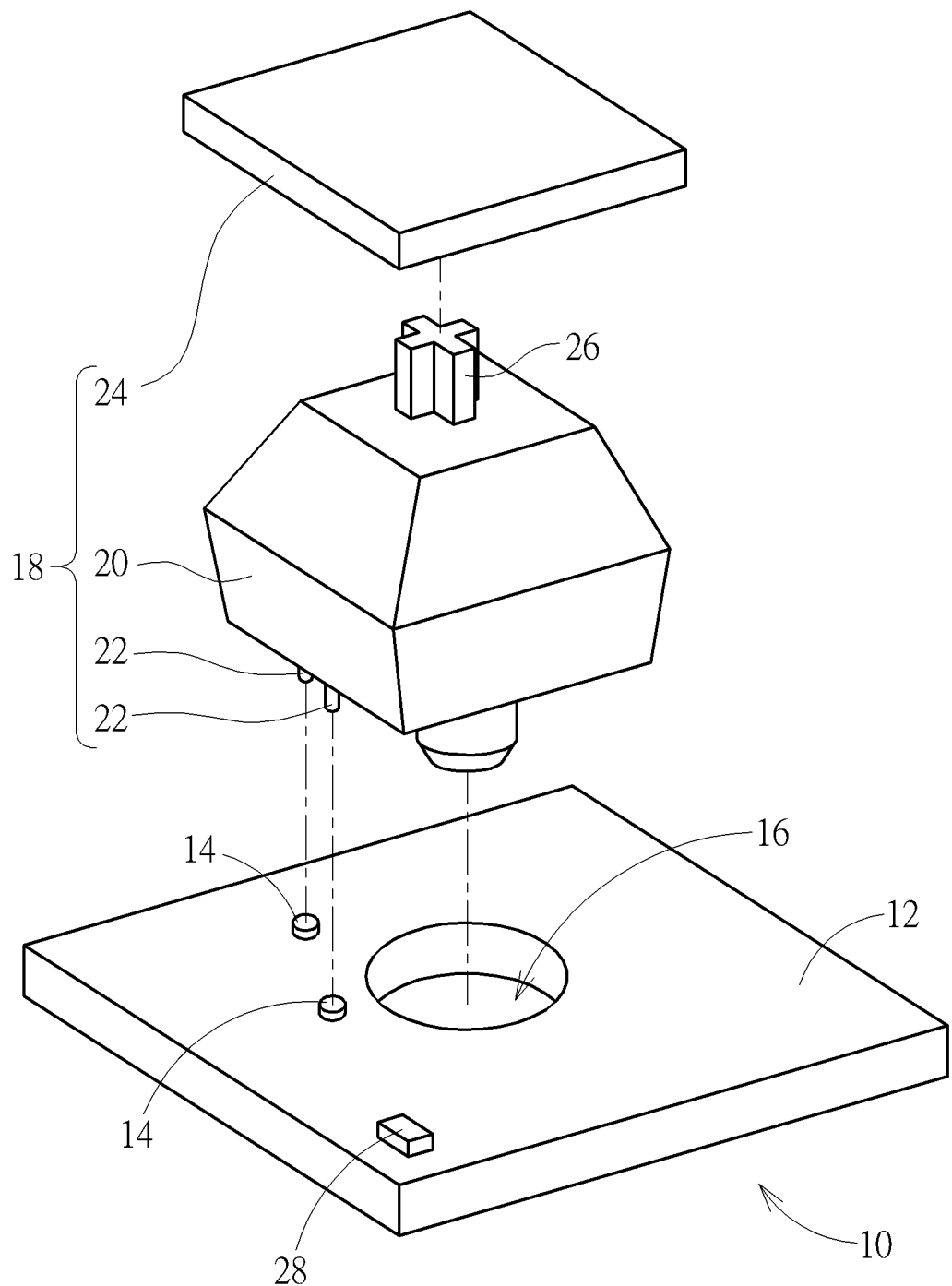
FIG. 2 is an exploded diagram of the universal circuit board applied to a mechanical keyswitch according to a first embodiment of the present invention.
Figure 3:
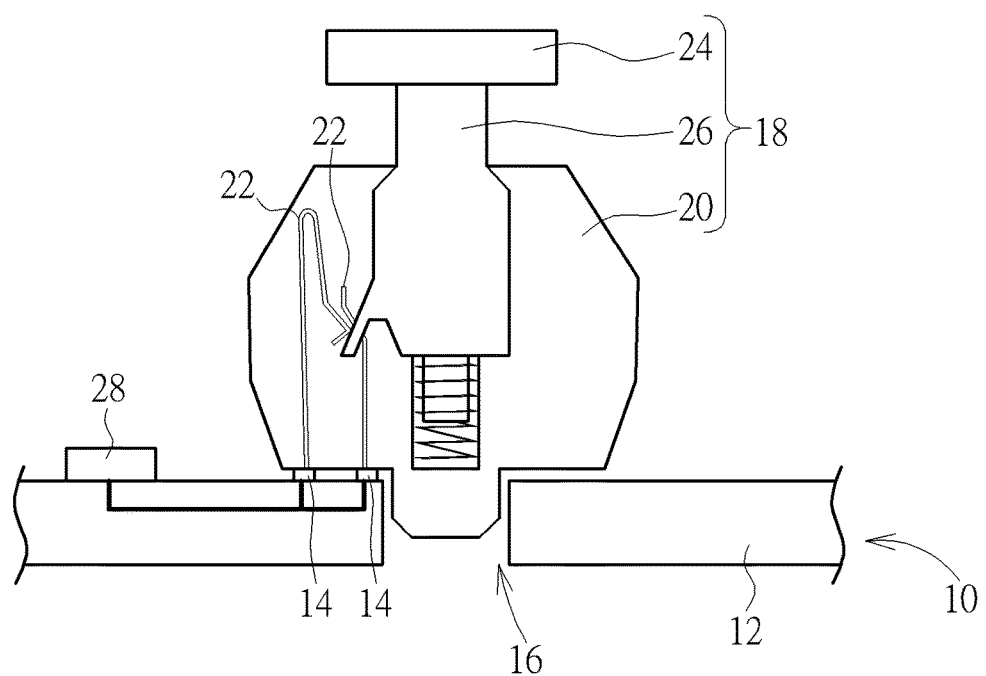
FIG. 3 is a structural lateral view of the universal circuit board and the mechanical keyswitch according to the first embodiment of the present invention.

Please refer to FIG. 2 and FIG. 3. FIG. 2 is an exploded diagram of the universal circuit board 10 applied to the mechanical keyswitch 18 according to a first embodiment of the present invention. FIG. 3 is a structural lateral view of the universal circuit board 10 and the mechanical keyswitch 18 according to the first embodiment of the present invention. The mechanical keyswitch 18 includes an axle body 20, a resilient component 22 and a keycap 24. The axle body 20 is directly disposed inside the opening structure 16 of the universal circuit board 10, and the keycap 24 is movably disposed on the axle body 20 via a supporting component 26. An end of the resilient component 22 is connected to the conductive terminal 14 of the universal circuit board 10, and the other end of the resilient component 22 contacts against the supporting component 26. While the mechanical keyswitch 18 is pressed and the keycap 24 is moved relative to the axle body 20, the resilient component 22 is resiliently deformed by pressure of the supporting component 26, and the resilient component 22 can establish a conduction channel to generate a conduction signal while the resilient component 22 is deformed at a critical point. The conduction signal is transmitted to the operational processing unit 28 of the universal circuit board 10 via the conductive terminal 14, and the operational processing unit 28 can execute an actuating command of the mechanical keyswitch 18 in accordance with the conduction signal.

In the first embodiment, the opening structure 16 of the universal circuit board 10 is functioned as a fixing unit for the mechanical keyswitch 18, dimensions of the opening structure 16 can be the same as or slightly larger than dimensions of the axle body 20. The conductive terminals 14 adjacent by the opening structure 16 are electrically connected to the operational processing unit 28 and adapted to transmit the conduction signal (which is generated by the actuated mechanical keyswitch 18) to the operational processing unit 28 for calculation. The operational processing unit 28 can be disposed on the main body 12, or can be an external processor outside of the universal circuit board 10. The operational processing unit 28 determines that the universal circuit board 10 is assembled with the mechanical keyswitch 18 while the conductive terminal 14 is detected to transmit the conduction signal. The axle body 20 of the mechanical keyswitch 18 not only can be fixed on the universal circuit board 10 via the opening structure 16, but also can be positioned optionally in an auxiliary welding, hooking or locking manner.

Figure 4:
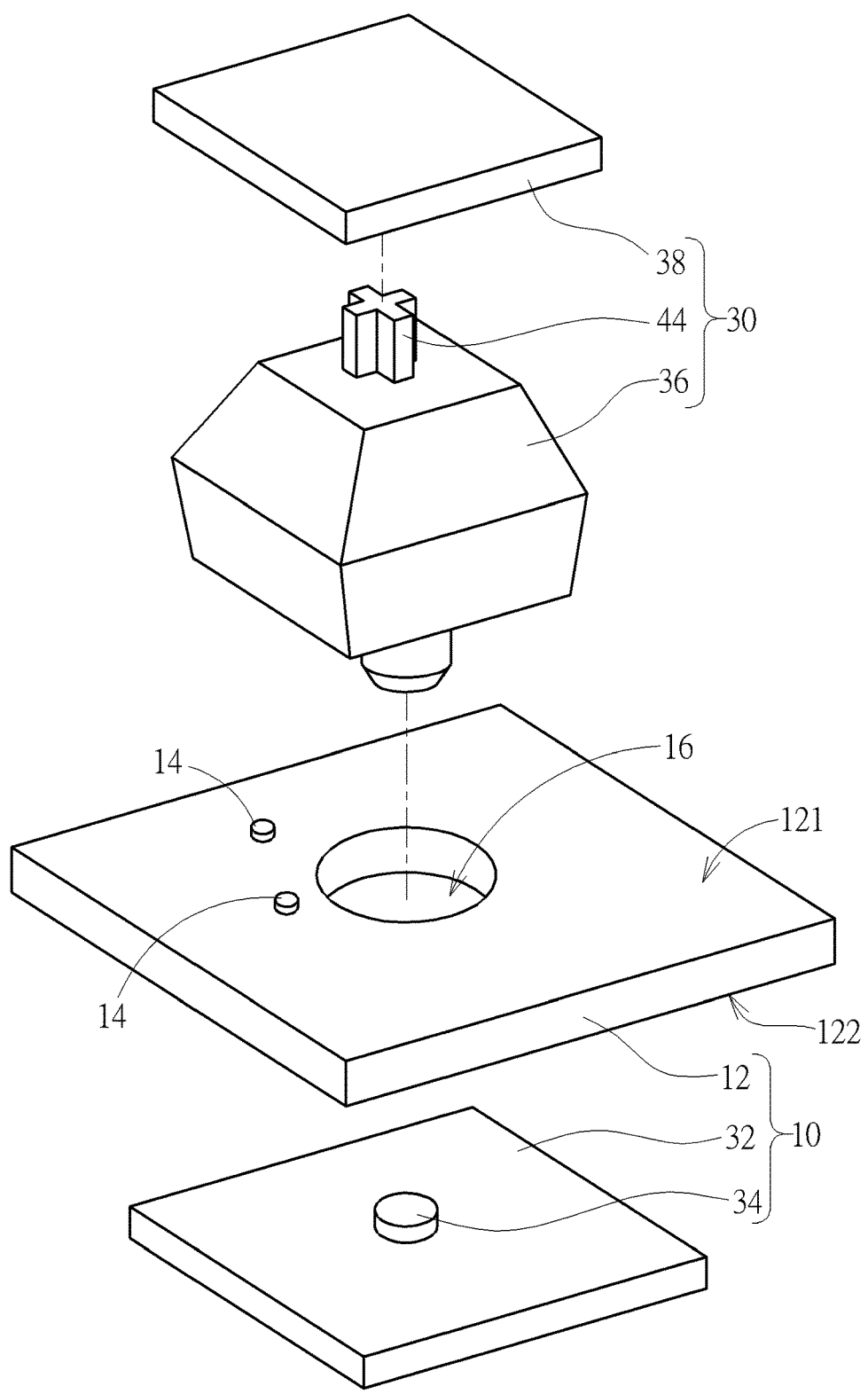
FIG. 4 is an exploded diagram of the universal circuit board applied to an optical keyswitch according to a second embodiment of the present invention.
Figure 5:
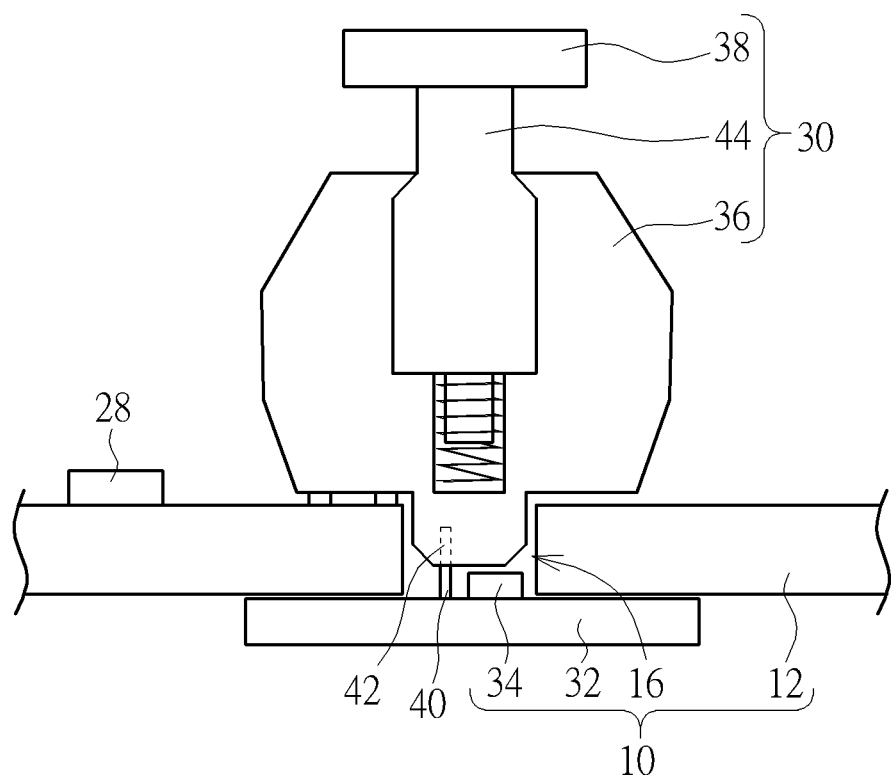
FIG. 5 is an assembly lateral view of the universal circuit board and the optical keyswitch according to the second embodiment of the present invention.

Please refer to FIG. 4 and FIG. 5. FIG. 4 is an exploded diagram of the universal circuit board 10 applied to the optical keyswitch 30 according to a second embodiment of the present invention. FIG. 5 is an assembly lateral view of the universal circuit board 10 and the optical keyswitch 30 according to the second embodiment of the present invention. In the second embodiment, the universal circuit board 10 includes the main body 12, the conductive terminal 14, the opening structure 16, a circuit substrate 32 and an optical detecting unit 34. The circuit substrate 32 is disposed on the second surface 122 of the main body 12. The optical detecting unit 34 is disposed on a side of the circuit substrate 32 facing the second surface 122, and aligns with the opening structure 16. The axle body 36 of the optical keyswitch 30 can be disposed on the main body 12 of the universal circuit board 10 in the welding, hooking or locking manner; the axle body 36 further can be assembled with the opening structure 16 by insertion. The opening structure 16 of the universal circuit board 10 provides fixing function for the optical keyswitch 30, and a hollow feature of the opening structure 16 is utilized to form an optical transmission channel. An optical detecting signal output by the optical detecting unit 34 can pass through the opening structure 16 and be exited from the first surface 121, and then the optical detecting signal is projected onto the supporting component 44 inside the axle body 36 to detect a movement of the keycap 38 of the optical keyswitch 30.

Figure 6:
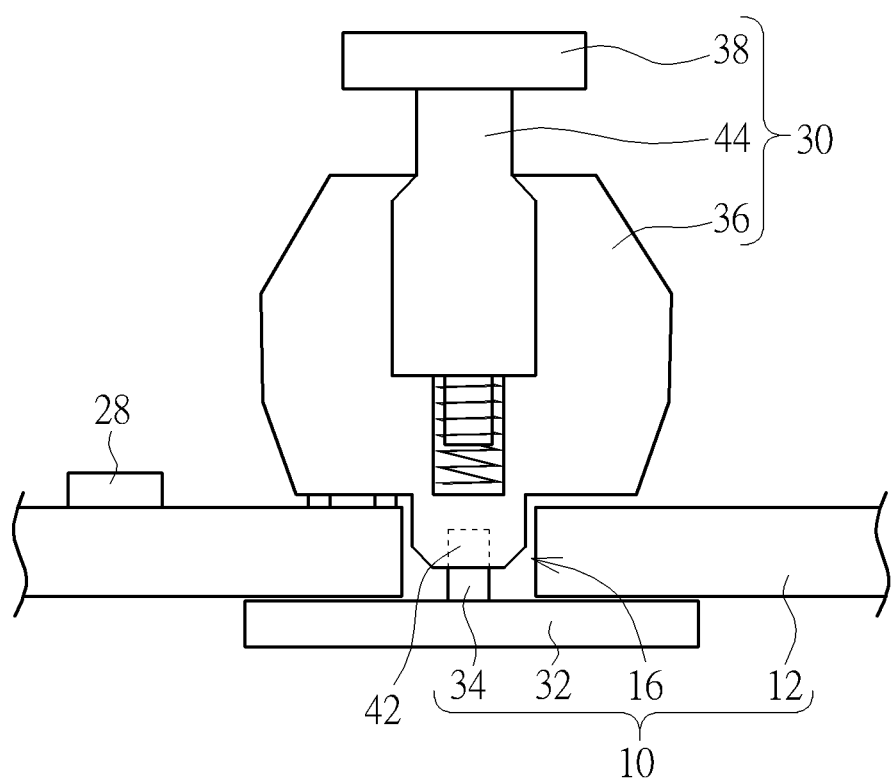
FIG. 6 is an assembly lateral view of the universal circuit board and the optical keyswitch according to a third embodiment of the present invention.
Figure 7:
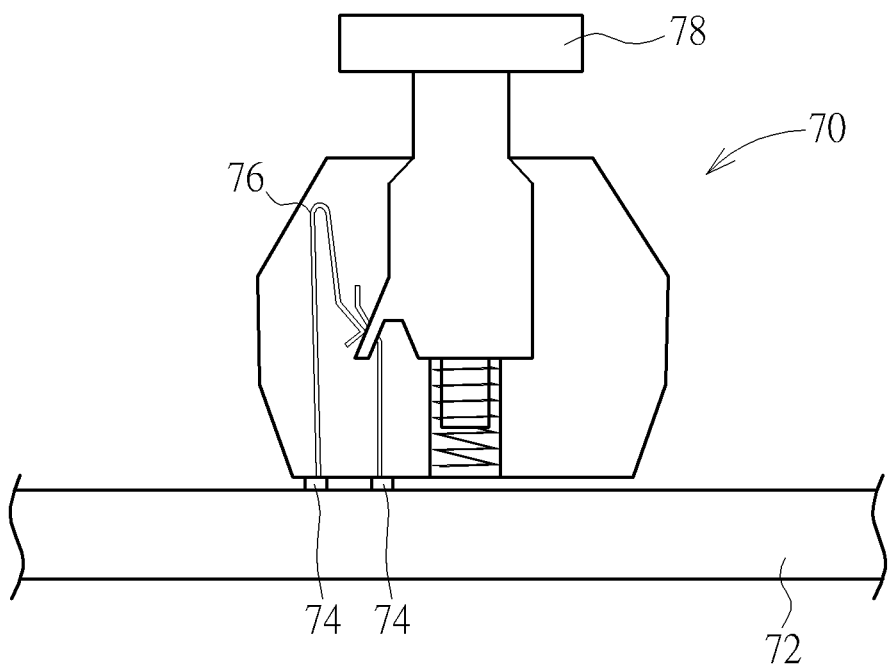
FIG. 7 is an assembly diagram of a keyswitch and a circuit board in prior art.

In the second embodiment, the universal circuit board 10 further can include a constraining component 40 disposed on a side of the circuit substrate 32 facing the second surface 122 and adapted to insert into the positioning hole structure 42 of the optical keyswitch 30. The constraining component 40 is an auxiliary unit to position the optical keyswitch 30 on the universal circuit board 10. Thus, the optical detecting unit 34 is slightly spaced from the optical keyswitch 30, and the optical detecting signal is projected into the axle body 36 to detect a movement of the supporting component 44 for determining whether the keycap 38 is pressed. Besides, the optical detecting unit 34 further can be a constraint applied to the optical keyswitch 30. Please refer to FIG. 6. FIG. 6 is an assembly lateral view of the universal circuit board 10 and the optical keyswitch 30 according to a third embodiment of the present invention. The optical detecting unit 34 in the third embodiment is erected on the circuit substrate 32 and directly inserted into the positioning hole structure 42 of the optical keyswitch 30; the constraining component can be optionally emitted in this application. The operational processing unit 28 of the second embodiment and the third embodiment can determine that the universal circuit board 10 is assembled with the optical keyswitch 30 while the conductive terminals 14 make no contact.

The universal circuit board of the present invention can be compatible for the mechanical keyswitch and the optical keyswitch. The mechanical keyswitch and the optical keyswitch are installed on the first surface of the main body of the universal circuit board in a detachable manner, and the keyswitch with any standards can be arbitrarily assembled with and disassembled from the universal circuit board according to the user's actual demand. The universal circuit board has the conductive terminals and the opening structure formed on the main body, the opening structure not only can be inserted by the mechanical keyswitch for constraint, but also can utilize the open-typed hole to establish the optical transmission channel for the optical detecting unit of the optical keyswitch. The operational processing unit of the universal circuit board can determine the universal circuit board is assembled with the mechanical keyswitch or the optical keyswitch according to the conduction signal about the conductive terminal and/or generation of the optical detecting signal, so as to activate related calculation for executing the actuating command of the keyswitch. Comparing to the prior art, the universal circuit board of the present invention can be compatible for the mechanical keyswitch and the optical keyswitch, the user can conveniently assemble and disassemble the keyswitch with any structural standards and the universal circuit board is applied to automatically acquire characteristics of the keyswitch for achieving the plug and play function.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A universal circuit board compatible for a mechanical keyswitch and an optical keyswitch, the universal circuit board comprising:
   a main body, having a first surface and a second surface opposite to each other;
   a plurality of conductive terminals disposed on the first surface of the main body;
   an opening structure formed on the main body and piercing through the first surface and the second surface, the opening structure being inserted by an axle body of the mechanical keyswitch or being an optical transmission channel of the optical key switch;
   a circuit substrate disposed on the second surface of the main body; and
   an optical detecting unit disposed on a side of the circuit substrate facing the second surface and aligning with the opening structure, an optical detecting signal output by the optical detecting unit passing through the opening structure and being exited from the first surface to detect a movement of a keycap of the optical key switch.

2. The universal circuit board of claim 1, wherein the plurality of conductive terminals are respectively connected to a plurality of resilient components of the mechanical keyswitch, the plurality of conductive terminals are utilized to transmit a conduction signal generated by deformation of the plurality of resilient components while a keycap of the mechanical keyswitch is moved related to the axle body and the plurality of resilient components are pressed and deformed.

3. The universal circuit board of claim 1, wherein the optical detecting unit is disposed inside a positioning hole structure of the optical keyswitch.

4. The universal circuit board of claim 1, further comprising:
   a constraining component disposed on the side of the circuit substrate facing the second surface and adapted to insert into a positioning hole structure of the optical key switch.

5. The universal circuit board of claim 1, further comprising:
   an operational processing unit disposed on the main body, the operational processing unit determining that the opening structure is assembled with the mechanical keyswitch while the plurality of conductive terminals are detected to transmit a conductive signal, and further determining that the opening structure is assembled with the optical keyswitch while the plurality of conductive terminals make no contact.

6. The universal circuit board of claim 1, wherein the mechanical keyswitch and the optical keyswitch are disposed on the first surface of the main body in a detachable manner.

* * * * *